United States Patent
Choi et al.

(10) Patent No.: US 8,633,479 B2
(45) Date of Patent: Jan. 21, 2014

(54) DISPLAY DEVICE WITH METAL OXIDEL LAYER AND METHOD FOR MANUFACTURING THE SAME

(75) Inventors: Jong-Hyun Choi, Yongin (KR); Ji-Yong Noh, Yongin (KR); Jang-Soon Im, Yongin (KR); Dae-Woo Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 427 days.

(21) Appl. No.: 12/923,434

(22) Filed: Sep. 21, 2010

(65) Prior Publication Data

US 2011/0068337 A1    Mar. 24, 2011

(30) Foreign Application Priority Data

Sep. 22, 2009   (KR) .................. 10-2009-0089802

(51) Int. Cl.
*H01L 29/10*     (2006.01)
(52) U.S. Cl.
USPC ........................................... 257/43
(58) Field of Classification Search
USPC ........................................... 257/43
See application file for complete search history.

(56) References Cited

U.S. PATENT DOCUMENTS

| 7,772,021 | B2 | 8/2010 | Lee et al. | |
|---|---|---|---|---|
| 2008/0315207 | A1* | 12/2008 | Yang et al. | 257/66 |
| 2009/0057663 | A1* | 3/2009 | Kim et al. | 257/43 |

FOREIGN PATENT DOCUMENTS

| JP | 2004151275 A | * | 5/2004 |
|---|---|---|---|
| JP | 2007-073559 A | | 3/2007 |
| JP | 2007-073560 A | | 3/2007 |
| KR | 10-0191091 B1 | | 1/1999 |
| KR | 10-0810639 B1 | | 2/2008 |
| KR | 10-2008-0048936 A | | 6/2008 |
| KR | 10-2009-0079619 A | | 7/2009 |

* cited by examiner

*Primary Examiner* — Ajay K Arora
(74) *Attorney, Agent, or Firm* — Lee & Morse, P.C.

(57) ABSTRACT

A display includes a substrate main body, a thin film transistor (TFT) on the substrate main body, the TFT including an oxide semiconductor layer and a metal oxide film sequentially stacked on top of each other.

16 Claims, 6 Drawing Sheets

DISPLAY DEVICE WITH METAL OXIDEL LAYER AND METHOD FOR MANUFACTURING THE SAME

BACKGROUND

1. Field

Embodiments relate to a display. More particularly, embodiments relate to an OLED display with an oxide semiconductor layer.

2. Description of the Related Art

An OLED display is a self-emission type display device that displays images by using organic light emission elements emitting light. Unlike a liquid crystal display (LCD), the OLED display does not require a separate light source, so it is thinner and lighter. In addition, since the OLED display has high quality characteristics, e.g., low power consumption, high luminance, high response speed, and the like, it is receiving much attention as a next-generation display device, e.g., of a mobile electronic device.

An OLED display may include oxide thin film transistors (TFTs), i.e., a TFT with an oxide semiconductor. However, the oxide semiconductor may have high carrier density because lack of oxygen within the oxide semiconductor increases the supply of carriers. Thus, electrical characteristics of the oxide semiconductor may be unstable.

The above information disclosed in this Description of the Related Art section is only for enhancement of understanding of the background of the described technology and therefore it may contain information that does not form the prior art that is already known in this country to a person of ordinary skill in the art.

SUMMARY

Embodiments are directed to a display with an oxide semiconductor layer, which substantially overcomes one or more of the problems due to the limitations and disadvantages of the related art.

It is therefore a feature of an embodiment to provide a display with an oxide semiconductor layer covered with a protection film for stably protecting the oxide semiconductor layer.

It is therefore another feature of an embodiment to provide a method of manufacturing a display with a protection film on an oxide semiconductor layer.

At least one of the above and other features and advantages may be realized by providing a display, including a substrate main body, a TFT formed on the substrate main body. The TFT may have a structure in which an oxide semiconductor layer and a metal oxide film are sequentially stacked.

The TFT may further include a gate electrode and source electrode and drain electrode being in contact with the oxide semiconductor layer, respectively, and disposed to be spaced apart. The oxide semiconductor layer may be insulated from the gate electrode. The metal oxide film may be formed on the oxide semiconductor layer and having a plurality of openings exposing portions of the oxide semiconductor layer. The source electrode and drain electrode may be contacted with the oxide semiconductor layer via the openings. Lengths of the oxide semiconductor layer and the metal oxide film may be substantially the same and overlap each other, the lengths of both the oxide semiconductor layer and the metal oxide film being measured along a first direction between respective outermost edges of the oxide semiconductor layer and the metal oxide film.

At least one of the above and other features and advantages may also be realized by providing a display, including a substrate main body, a gate electrode formed on the substrate main body, a gate insulating layer formed on the gate electrode, an oxide semiconductor layer formed on the gate electrode with the gate insulating layer interposed therebetween, a metal oxide film formed directly on the oxide semiconductor layer and having a plurality of openings exposing portions of the oxide semiconductor layer, and source and drain electrodes being in contact with the oxide semiconductor layer via the openings of the metal oxide film, and disposed to be spaced apart.

The display may further include an interlayer insulating layer formed between the metal oxide film and the source and drain electrodes. The interlayer insulating layer may have a plurality of contact holes exposing portions of the oxide semiconductor layer together with the openings of the metal oxide film.

In the display, the oxide semiconductor layer and the metal oxide film may have the same pattern, except for the plurality of openings. A length of the oxide semiconductor layer may be defined between two first outermost edges thereof, and a length of the metal oxide film may be defined between two second outermost edges thereof, the lengths of the oxide semiconductor layer and the metal oxide film being substantially the same, and first outermost edges being aligned with respective second outermost edges. Portions of the metal oxide film and portions of the source and drain electrodes in the openings of the metal oxide film may be arranged to completely overlap the oxide semiconductor layer.

The oxide semiconductor layer may contain one or more of gallium (Ga), indium (In), zinc (Zn), hafnium (Hf), and tin (Sn), as well as oxygen (O).

The metal oxide film may be made of one of metals among aluminum (Al), molybdenum (Mo), nickel (Ni), silver (Ag), chromium (Cr), titanium (Ti), and tantalum (Ta), or an alloy including one or more of the metals. The metal oxide film may have an average thickness ranging from 50 Å to 2000 Å. The metal oxide film may be formed by applying heat to the metal film, or through plasma oxidization.

At least one of the above and other features and advantages may also be realized by providing a method of manufacturing a display, including forming a gate electrode on a substrate main body, forming a gate insulating layer on the gate electrode, sequentially stacking an oxide semiconductor layer and a metal film on the gate insulating layer, oxidizing the metal film to produce a metal oxide film, patterning the oxide semiconductor layer and the metal oxide film such that they have the same shape, removing portions of the metal oxide film to form a plurality of openings exposing the oxide semiconductor layer, and forming source and drain electrodes such that they are in contact with the oxide semiconductor layer via the openings of the metal oxide film, and disposed to be spaced apart.

The oxide semiconductor layer and the metal film may be successively deposited under a vacuum atmosphere.

The metal oxide film and the oxide semiconductor layer may be successively patterned through an etching process.

The patterned oxide semiconductor layer and the metal oxide film may be formed such that at least portions of the oxide semiconductor layer and the metal oxide film overlap with the gate electrode.

The method may further include forming an interlayer insulating layer between the metal oxide film and the source and drain electrodes.

The method may further include forming a plurality of contact holes at the interlayer insulating layer, wherein the plurality of contact holes and the plurality of openings of the metal oxide film may be successively formed through an etching process.

The metal oxide film may serve as an etching stopper preventing the oxide semiconductor layer from being damaged or partially etched in the process of forming the plurality of contact holes through the etching process.

The oxide semiconductor layer may contain one or more of gallium (Ga), indium (In), zinc (Zn), hafnium (Hf), and tin (Sn), as well as oxygen (O).

The metal oxide film may be made of one or more of aluminum (Al), molybdenum (Mo), nickel (Ni), silver (Ag), chromium (Cr), titanium (Ti), and tantalum (Ta), or an alloy including one or more of the metals.

The metal oxide film may have an average thickness ranging from 50 Å to 2000 Å. The metal oxide film may be formed by applying heat to the metal film, or through plasma oxidization.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
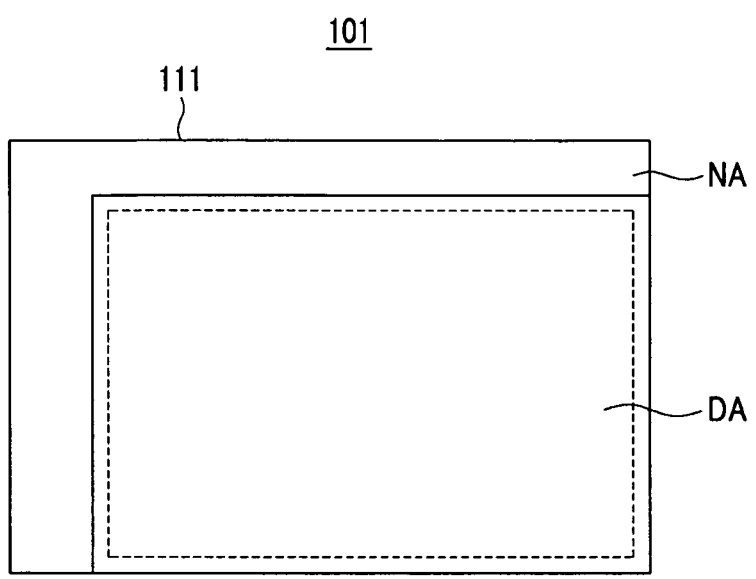
FIG. 1 illustrates a schematic plan view of a display according to an exemplary embodiment.

Korean Patent Application No. 10-2009-0089802, filed on Sep. 22, 2009, in the Korean Intellectual Property Office, and entitled "Organic Light Emitting Diode Display and Method for Manufacturing the Same" is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

An exemplary embodiment of an OLED display will now be described with reference to FIGS. 1 to 3.

As illustrated in FIG. 1, an OLED display 101 may include a substrate main body 111 divided into a display area (DA) and a non-display area (NA). A plurality of pixels may be formed on the display area DA of the substrate main body 111 to display an image, and various driving circuits may be formed on the non-display area (NA). One pixel (PE) of the plurality of pixels of the OLED display 101 is illustrated in FIG. 2.

Figure 2:
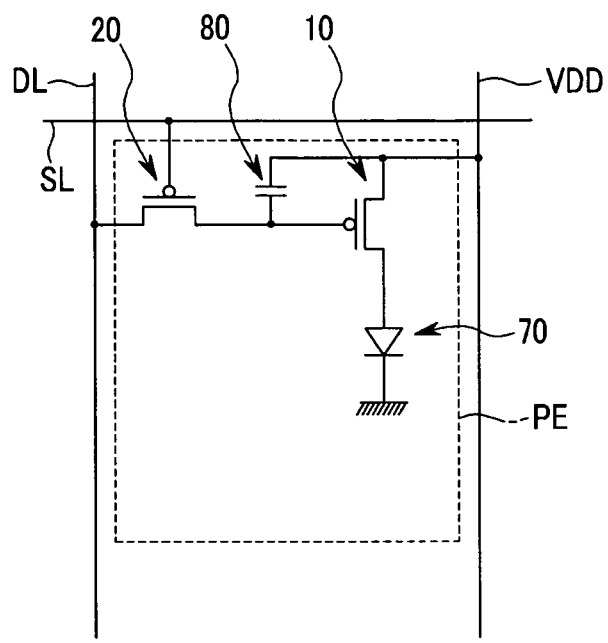
FIG. 2 illustrates a circuit diagram of a pixel circuit in the display of FIG. 1.

As illustrated in FIG. 2, a single pixel PE of the OLED display 101 may have a 2Tr-1Cap structure including an organic light emitting element 70, first and second TFTs 10 and 20, and a storage capacitor 80. However, example embodiments are not limited thereto. That is, the OLED display 101 may include three or more TFTs and two or more storage capacitors in a single pixel, and may further include wiring to have various structures. The additionally formed TFTs and storage capacitors may constitute a compensation circuit. The compensation circuit may improve uniformity of the organic light emitting element 70 formed at each pixel PE by suppressing generation of deviation in picture quality. For example, the compensation circuit may include four to eight TFTs. A driving circuit formed on the non-display area (NA) of the substrate main body 111 may include, e.g., one TFT.

The organic light emitting element 70 may include an anode electrode, i.e., a hole injection electrode, a cathode electrode, i.e., an electron injection electrode, and an organic light emission layer disposed between the anode electrode and the cathode electrode.

In an exemplary embodiment, each of the first and second TFTs 10 and 20 may include a gate electrode, an oxide semiconductor layer, a source electrode, and a drain electrode. That is, the first and second TFTs 10 and 20 may be oxide TFTs.

For example, the first TFT 10 may be a driving TFT 10, and the second TFT 20 may be a switching TFT 20. For example, as illustrated in FIG. 2, the driving TFT 10 is connected with the organic light emitting element 70, and the switching TFT 20 is connected to a scan line SL and a data line DL. In detail, the switching TFT 20 may be used as a switching element for selecting a pixel PE intended to emit light. The gate electrode of the switching TFT 20 may be connected with the scan line SL, and the source electrode of the switching TFT 20 is connected with the data line DL. The switching TFT 20 transfers a data voltage input from the data line DL to the driving TFT 10 according to a switching voltage input to the scan line SL.

The storage capacitor 80 is connected with the switching TFT 20 and a common power line VDD, and stores a voltage corresponding to a difference between the voltage received from the switching TFT 20 and the voltage supplied to the common power line VDD.

The driving TFT 10 supplies driving power for emitting the organic light emitting element 70 within the selected pixel PE. The gate electrode of the driving TFT 10 is connected with one capacitor plate of the storage capacitor 80 and with the drain electrode of the switching TFT 20. The source electrode of the driving TFT 10 and another capacitor plate of the storage capacitor 80 are connected with the common power line VDD. The drain electrode of the driving TFT 10 is connected with the anode electrode of the organic light emitting element 70. In this manner, the driving TFT 10 connected with the common power line VDD and the storage capacitor 80 supplies an output current $I_{OLED}$ that is proportional to the square of the difference between the voltage stored in the storage capacitor 80 and a threshold voltage to the organic light emitting element 70. The organic light emitting element 70 emits light by the output current $I_{OLED}$ supplied from the driving TFT 10.

The configuration of the pixel PE may be variably modified without being limited to the configuration as described above.

The structure of the driving TFT 10 according to an exemplary embodiment will now be described in detail according to the stacking order of the driving TFT 10.

Figure 3:
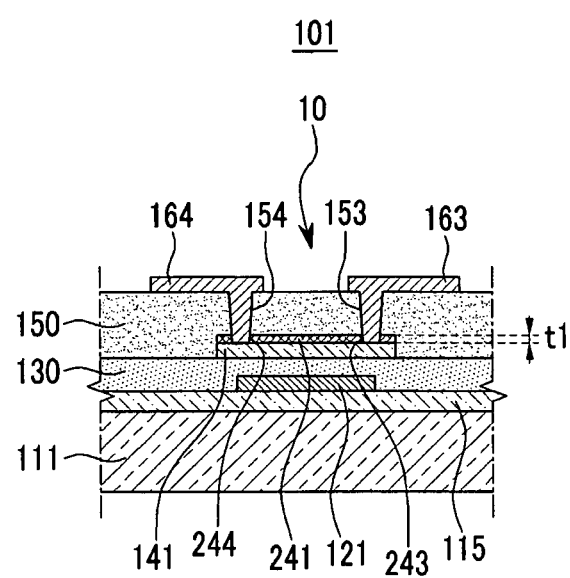
FIG. 3 illustrates a detailed cross-sectional view of a TFT in the display of FIG. 1.

As illustrated in FIG. 3, the driving TFT 10 may be formed on the substrate main body 111, and may include a gate electrode 121, an oxide semiconductor layer 141, a metal oxide film 241, a source electrode 163, and a drain electrode 164.

The substrate main body 111 may be formed as an insulating substrate, e.g., the substrate main body 111 may include one or more of glass, quartz, ceramic, plastic, and the like. However, example embodiments are not limited thereto, and the substrate main body 111 may be formed as a metal substrate, e.g., the substrate main body 111 may include stainless steel.

A buffer layer 115 may be formed on the substrate main body 111. The buffer layer 115 may be formed to include one or more of various inorganic films and organic films. The buffer layer 115 may prevent penetration of contaminants, e.g., an impurity element or moisture, into the substrate main body 111, and may smooth an upper surface of the substrate main body 111. However, the buffer layer 115 may be omitted according to the type and processing conditions of the substrate main body 111.

The gate electrode 121 of the driving TFT 10 may be formed on the substrate main body 111, e.g., directly on the buffer layer 115. The gate electrode 121 may be formed of a conductive material. For example, the gate electrode 121 may be formed of metal, e.g., one or more of Al, Ag, Cr, Ti, Ta, Mo, etc., or an alloy including one or more of the metal. The gate electrode 121 may be formed as a single layer or a multi-layer. For example, if the gate electrode 121 is a multi-layer, the gate electrode 121 may include a metal film, e.g., one or more of Cr, Mo, Ti, and Ta and/or an alloy thereof, having good physical and chemical characteristics, and an Al-based or Ag-based metal film having low specific resistance. In another example, the gate electrode 121 may be formed of a doped polycrystalline silicon film.

A gate insulating layer 130, e.g., formed of one or more of silicon nitride ($SiN_x$), silicon oxide ($SiO_x$), and the like, may be formed on, e.g., directly on, the gate electrode 121. However, in an exemplary embodiment, the material of the gate insulating layer 130 is not limited thereto.

The oxide semiconductor layer 141 of the driving TFT 10 may be formed on, e.g., directly on, the gate insulating layer 130. At least a portion of the oxide semiconductor layer 141 may overlap the gate electrode 121.

The oxide semiconductor layer 141 may be formed of an oxide, e.g., an oxide of one or more of gallium (Ga), indium (In), zinc (Zn), hafnium (Hf), and tin (Sn). For example, the oxide semiconductor layer 141 may be formed of a mixture oxide, e.g., InZnO, InGaO, InSnO, ZnSnO, GaSnO, GaZnO, or GaInZnO.

The driving TFT 10 with the oxide semiconductor layer 141 may have an effective mobility of electrical charges, e.g., high electron mobility and reliability, that is higher than that of a conventional TFT, e.g., a TFT with a hydrogenated amorphous silicon semiconductor layer, by a factor of about 2 to about 100. Further, the driving TFT 10 with the oxide semiconductor layer 141 may have an ON/OFF current ratio of about 105 to about 108, thereby exhibiting excellent semiconductor characteristics and performance. In addition, the oxide semiconductor layer 141 may have a band gap ranging from about 3.0 eV to about 3.5 eV, so a leakage of light current may not occur with regard to visible light. Thus, an instantaneous afterimage of the driving TFT 10 may be prevented. Also, in order to further improve the characteristics of the driving TFT 10, a group three element, a group four element, a group five element, or a transition element of the periodic table may be additionally included in the oxide semiconductor layer 141. It is further noted that the OLED display 101 with the TFT 10 may exhibit superior uniformity, e.g., as compared with a TFT using polycrystalline silicon, and may be implemented, e.g., as a transparent display device.

The metal oxide film 241 may be formed, e.g., directly, on the oxide semiconductor layer 141, e.g., the oxide semiconductor layer 141 may be directly between the gate insulating layer 130 and the metal oxide film 241. The metal oxide film 241 may include a plurality of openings, e.g., source and drain openings 243 and 244, exposing portions of the oxide semiconductor layer 141, e.g., an upper surface of the oxide semiconductor layer 141 facing away from the main body substrate 111. In other words, the oxide semiconductor layer 141 and the metal oxide film 241 may be sequentially stacked on the gate insulating layer 130.

With the exception of the plurality of openings, i.e., source and drain openings 243 and 244, the metal oxide film 241 may be formed to have the same pattern as that of the oxide semiconductor layer 141. For example, with the exception of the plurality of openings, lengths of the oxide semiconductor layer 141 and metal oxide film 241 may be substantially the same, so the oxide semiconductor layer 141 and metal oxide film 241 may overlap each other.

The metal oxide film 241 may function as a protection film to prevent or substantially minimize damage to the oxide semiconductor layer 141, e.g., by plasma. For example, the metal oxide film 241 may shield the oxide semiconductor layer 141 from external elements, e.g., moisture, oxygen absorption, or the like. In contrast, in a conventional OLED display, e.g., a display without a metal oxide film covering the oxide semiconductor layer, the oxide semiconductor layer may be unstable due to a relatively high carrier density, e.g., electrical characteristics of the oxide semiconductor may easily change due to interaction of the oxide semiconductor with plasma, moisture and/or oxygen, thereby providing relatively low reliability and operability. Therefore, the OLED display 101 with the metal oxide film 241 may have improved reliability and operability due to a stable and reliable oxide semiconductor TFT implemented therein.

The metal oxide film 241 may be formed by oxidizing a metal film, e.g., one or more of aluminum (Al), molybdenum (Mo), nickel (Ni), silver (Ag), chromium (Cr), titanium (Ti), tantalum (Ta), or an alloy including one or more metals. The metal film may be oxidized by any suitable method, e.g., the metal film may be oxidized by applying heat or by using plasma oxidization.

The metal oxide film 241 may have an average thickness t1 ranging from about 50 Å to about 2000 Å. The average thickness t1 refers to a distance measured along a normal to an upper surface of the semiconductor layer 141 between lower and upper surfaces of the metal oxide film 241 in regions excluding the source and drain openings 243 and 244. It is noted that the terms "thickness" and "average thickness" may be used interchangeably. If the average thickness t1 of the metal oxide film 241 is smaller than about 50 Å, the thickness of the metal oxide film 241 may be insufficient to properly protect the oxide semiconductor layer 141, e.g., contaminants or plasma may penetrate through the metal oxide film 241 to damage the oxide semiconductor layer 141. If the average thickness t1 of the metal oxide film 241 is larger than about 2000 Å, a negative influence may be imparted to the oxide semiconductor layer 141 in the process of depositing and oxidizing the metal film of the metal oxide film 241, e.g., the oxide semiconductor layer 141 may be damaged when a relatively thick layer is being deposited and processed thereon.

An interlayer insulating layer 150 may be formed on the metal oxide film 241. The interlayer insulating layer 150 may have a plurality of contact holes 153 and 154 exposing portions of the oxide semiconductor layer 141 together with the plurality of openings 243 and 244 of the metal oxide film 241. The plurality of contact holes may include a source contact hole 153 corresponding to, e.g., being aligned with, the source opening 243 and a drain contact hole 154 corresponding to, e.g., being aligned with, the drain opening 244. Like the gate insulating layer 130, the interlayer insulating layer 150 may include silicon nitride ($SiN_x$), silicon oxide ($SiO_x$), or the like, but is not limited thereto.

The source electrode 163 and the drain electrode 164 may be separately formed, e.g., spaced apart from each other, on the interlayer insulating layer 150. The source electrode 163 and the drain electrode 164 may be in contact with the oxide semiconductor layer 141 via the source contact hole 153 and the drain contact hole 154 of the interlayer insulating layer 150, and the source opening 243 and the drain opening 244 of the metal oxide film 241. For example, the source contact hole 153 and the source opening 243 may be aligned, so the source electrode 163 may penetrate through the source contact hole 153 and the source opening 243 to contact; e.g., directly contact, the oxide semiconductor layer 141. The structure of the drain electrode 164 with respect to the drain contact hole 154 and the drain opening 244 may be the same as that of the source electrode 163 with respect to respective holes/openings.

It is noted that exemplary embodiments are not limited to the described above, e.g., the interlayer insulating layer 150 may be omitted. If the interlayer insulating layer 150 is omitted, the source electrode 163 and the drain electrode 164 may be formed directly on the metal oxide film 241, and portions of the source electrode 163 and the drain electrode 164 may be in contact with the oxide semiconductor layer 141 via the source opening 243 and the drain opening 244.

The OLED display 101 according to an exemplary embodiment may include the driving TFT 10 with the metal oxide film 241 directly on the oxide semiconductor layer 141, so the oxide semiconductor layer 141 may be effectively protected. That is, the metal oxide film 241 may prevent or substantially minimize exposure of the oxide semiconductor layer 141 to its external surroundings, e.g., plasma or contaminants, thereby increasing its stability, i.e., minimizing interaction of the oxide semiconductor layer 141 with its external surroundings. Therefore, the driving TFT 10 of the OLED display 101 may have increased stability and improved performance.

Figure 4:
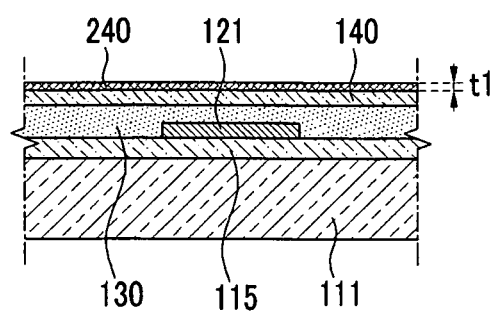
FIGS. 4 to 6 illustrate cross-sectional views of stages in a manufacturing process of the TFT of FIG. 3.
Figure 5:
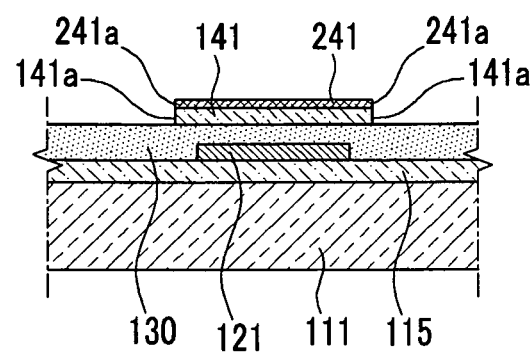
Figure 6:
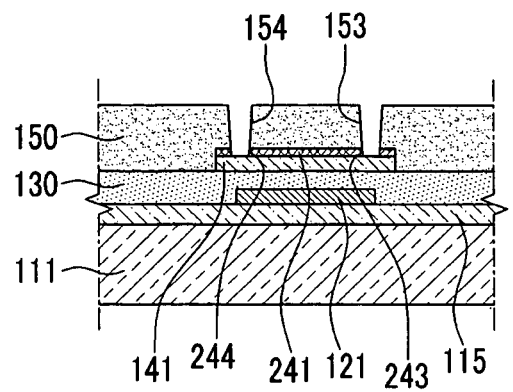

A method of manufacturing the OLED display 101 according to an exemplary embodiment will now be described with reference to FIGS. 4-6. FIGS. 4-6 illustrate cross-sectional views of stages in the process of forming the TFT 10 of the OLED display 101.

First, as illustrated in FIG. 4, the buffer layer 115 may be formed on the substrate main body 111, and a conductive film may be deposited on the buffer layer 115. Next, the conductive film may be patterned to form the gate electrode 121.

Then, the gate insulating layer 130 may be formed on the substrate main body 111 to cover the gate electrode 121. The gate insulating layer 130 may be formed of silicon nitride ($SiN_x$), silicon oxide ($SiO_x$), or the like.

Thereafter, as further illustrated in FIG. 4, a preliminary oxide semiconductor layer 140 and a preliminary metal film may be sequentially deposited on the gate insulating layer 130. For example, the preliminary oxide semiconductor layer 140 and the preliminary metal film may be successively deposited on the gate insulating layer 130 under a vacuum atmosphere. Therefore, by minimizing the process that should be necessarily performed following the deposition of the preliminary oxide semiconductor layer 140, the preliminary oxide semiconductor layer 140 may be prevented from being unnecessarily damaged. In other words, as deposition of the preliminary metal film follows immediately the deposition of the preliminary oxide semiconductor layer 140 under vacuum conditions, any interaction of the preliminary oxide semiconductor layer 140 with external elements, e.g., moisture or oxygen, during deposition thereof may be prevented or substantially minimized. The preliminary oxide semiconductor layer 140 and/or the preliminary metal film may be deposited by any suitable method, e.g., a physical vapor deposition (PVD) method, sputtering, evaporation, and the like.

Next, the preliminary metal film may be oxidized to form a preliminary metal oxide film 240. For example, the preliminary metal film may be oxidized by heating or plasma oxidization. Also, the preliminary metal oxide film 240 may be formed to have an average thickness t1 ranging from about 50 Å to about 2000 Å.

Thereafter, as illustrated in FIG. 5, the preliminary oxide semiconductor layer 140 and the preliminary metal oxide film 240 may be patterned to form the oxide semiconductor layer 141 and the metal oxide film 241, respectively. The patterned oxide semiconductor layer 141 and metal oxide film 241 may have the substantially same shape. For example, the patterned oxide semiconductor layer 141 and metal oxide film 241 may completely overlap each other, so outermost edges 141a of the patterned oxide semiconductor layer 141 may be aligned with respective outermost edges 241a of the metal oxide film 241. The patterned oxide semiconductor layer 141 and metal oxide film 241 may be formed, such that at least portions thereof overlap with the gate electrode 121. For example, the patterned oxide semiconductor layer 141 may completely overlap the gate electrode 121.

The metal oxide film 241 and the oxide semiconductor layer 141 may be successively patterned through an etching process. For example, an upper surface of the oxide semiconductor layer 141, i.e., a surface contacting the metal oxide film 241, may be covered by the metal oxide film 241 during the etching process, so the oxide semiconductor layer 141 may be protected during the etching process. Thus, the overall process of the OLED display 101 may be simplified, and the oxide semiconductor layer 141 may be prevented from being unnecessarily damaged during the patterning process.

Subsequently, as illustrated in FIG. 6, the interlayer insulating layer 150 may be formed on the metal oxide film 241. A portion of the interlayer insulating layer 150 and a portion of the metal oxide film 241 may be successively removed to form the plurality of contact holes 153 and 154 and the plurality of openings 243 and 244 exposing portions of the oxide semiconductor layer 141.

The plurality of contact holes 153 and 154 and the plurality of openings 243 and 244 may be formed through an etching process. In this case, the metal oxide film 241 may function as an etching stopper. That is, the metal oxide film 241 may have a different etching selectivity from that of the interlayer insulating layer 150, so the metal oxide film 241 may prevent the oxide semiconductor layer 141 from being damaged or from being partially etched in the process of forming the plurality of contact holes 153 and 154 through the etching process.

The operational effect of the metal oxide film 241 as an etching stopper will now be described in detail.

When forming the source contact hole 153 and the drain contact hole 154 through the interlayer insulating layer 150, other portions of the interlayer insulating layer 150 and the gate insulating layer 130 may also be etched at the same time, e.g., to form additional openings for wiring connections. For example, in order to connect wiring formed on an underlying layer of the gate electrode 121 and wiring formed on an underlying layer of the source electrode 163 and the drain electrode 164, portions of the interlayer insulating layer 150 and the gate insulating layer 130 may be etched. In this case, the etching process conditions are set to etch both the interlayer insulating layer 150 and the gate insulating layer 130, while the source contact hole 153 and the drain contact hole 154 are formed relatively earlier. Thus, since the metal oxide film 241, having the relatively different etching selectivity from that of the interlayer insulating layer 150 and the gate insulating layer 130, is on the oxide semiconductor layer 141, the oxide semiconductor layer 141 may be shielded from the etchant by the metal oxide film 241, thereby having no etching damage. In contrast, if a metal oxide film is not formed on an oxide semiconductor layer, the oxide semiconductor layer may be exposed via the source and drain contact holes 153 and 154 to an etchant, e.g., etching to connected multi layered wiring, for a longer time than necessary. As such, an oxide semiconductor layer not covered by a metal oxide film may be damaged or partially etched during the etching process.

Thereafter, as illustrated in FIG. 3, the source electrode 163 and the drain electrode 164 may be formed to be spaced apart on the interlayer insulating layer 150. In this case, the source electrode 163 and the drain electrode 164 may be in contact with the oxide semiconductor layer 141 via the contact holes 153 and 154 of the interlayer insulating layer 150 and the openings 243 and 244 of the metal oxide film 241. It is noted that the interlayer insulating layer 150 may be omitted.

Through the manufacturing method as described above, the TFT 10 according to an exemplary embodiment may be formed. Thus, in the OLED display 101, the oxide semiconductor layer 141 may be effectively protected to secure stability and improve performance of the TFT 10.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A display, comprising:
a substrate main body;
a gate electrode on the substrate main body;
a gate insulating layer on the gate electrode;
an oxide semiconductor layer on the gate electrode, the gate insulating layer being between the gate electrode and the oxide semiconductor;
a metal oxide film directly on the oxide semiconductor layer and including a plurality of openings exposing portions of the oxide semiconductor layer;
source and drain electrodes spaced apart from each other and in contact with the oxide semiconductor layer via the openings in the metal oxide film; and
an interlayer insulating layer between the metal oxide film and the source and drain electrodes.

2. The display as claimed in claim 1, wherein the interlayer insulating layer has a plurality of contact holes exposing portions of the oxide semiconductor layer, the plurality of contact holes being aligned with openings in the metal oxide film.

3. The display as claimed in claim 1, wherein:
a length of the oxide semiconductor layer is defined between two first outermost edges thereof, and
a length of the metal oxide film is defined between two second outermost edges thereof, the lengths of the oxide semiconductor layer and the metal oxide film being substantially the same, and first outermost edges being aligned with respective second outermost edges.

4. The display as claimed in claim 1, wherein portions of the metal oxide film and portions of the source and drain electrodes in the openings of the metal oxide film are arranged to completely overlap the oxide semiconductor layer.

5. The display as claimed in claim 1, wherein the oxide semiconductor layer includes oxygen and one or more of gallium (Ga), indium (In), zinc (Zn), hafnium (Hf), and tin (Sn).

6. The display as claimed in claim 1, wherein the metal oxide film includes at least one of aluminum (Al), molybdenum (Mo), nickel (Ni), silver (Ag), chromium (Cr), titanium (Ti), tantalum (Ta), and an alloy thereof.

7. The display as claimed in claim 6, wherein the metal oxide film has a thickness of about 50 Å to about 2000 Å.

8. A method of manufacturing a display, the method comprising:
forming a gate electrode on a substrate main body;
forming a gate insulating layer on the gate electrode;
sequentially stacking an oxide semiconductor layer and a metal oxide film on the gate insulating layer;
removing portions of the metal oxide film to form a plurality of openings exposing portions of the oxide semiconductor layer;
forming source and drain electrodes spaced apart from each other and in contact with the oxide semiconductor layer via the openings in the metal oxide film; and
forming an interlayer insulating layer between the metal oxide film and the source and drain electrodes.

9. The method as claimed in claim 8, wherein sequentially stacking the oxide semiconductor layer and the metal oxide film includes:
stacking a metal film on the oxide semiconductor layer;
oxidizing the metal film to form the metal oxide film, such that the metal oxide film is directly on the oxide semiconductor layer; and
patterning the oxide semiconductor layer and the metal oxide film to have a same shape.

10. The method as claimed in claim 9, wherein patterning the oxide semiconductor layer and the metal oxide film includes successively patterning the metal oxide film and the oxide semiconductor layer through an etching process.

11. The method as claimed in claim 9, wherein patterning the oxide semiconductor layer and the metal oxide film includes arranging at least a portion of each of the patterned oxide semiconductor layer and the metal oxide film to overlap the gate electrode.

12. The method as claimed in claim 8, further comprising forming a plurality of contact holes through the interlayer insulating layer, the plurality of contact holes and the plurality of openings in the metal oxide film being successively formed through an etching process.

13. The method as claimed in claim 12, wherein forming the plurality of contact holes in the interlayer insulating layer is performed before forming the openings in the metal oxide, the metal oxide film having an etching electivity with respect to the interlayer insulating layer.

14. The method as claimed in claim 8, wherein the oxide semiconductor layer is formed to include one or more of gallium (Ga), indium (In), zinc (Zn), hafnium (Hf), and tin (Sn), and the metal oxide film is formed of one or more of aluminum (Al), molybdenum (Mo), nickel (Ni), silver (Ag), chromium (Cr), titanium (Ti), and tantalum (Ta), and an alloy thereof.

15. The method as claimed in claim 9, wherein oxidizing the metal film includes applying heat to the metal film or using plasma oxidization, the metal oxide film having a thickness of about 50 Å to about 2000 Å.

16. The method as claimed in claim 9, wherein sequentially stacking the oxide semiconductor layer and metal film includes successively depositing the oxide semiconductor layer and the metal film under a vacuum atmosphere.

\* \* \* \* \*